US009196541B2

(12) United States Patent
Zhu et al.

(10) Patent No.: US 9,196,541 B2
(45) Date of Patent: Nov. 24, 2015

(54) SRAM CELL AND METHOD FOR MANUFACTURING THE SAME

(75) Inventors: Huilong Zhu, Poughkeepsie, NY (US); Qingqing Liang, Lagrangeville, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 434 days.

(21) Appl. No.: 13/509,912

(22) PCT Filed: Nov. 21, 2011

(86) PCT No.: PCT/CN2011/082519
§ 371 (c)(1),
(2), (4) Date: May 15, 2012

(87) PCT Pub. No.: WO2013/040833
PCT Pub. Date: Mar. 28, 2013

(65) Prior Publication Data
US 2013/0069167 A1 Mar. 21, 2013

(30) Foreign Application Priority Data

Sep. 21, 2011 (CN) .......................... 2011 1 0282569

(51) Int. Cl.
*H01L 21/70* (2006.01)
*H01L 21/8234* (2006.01)
*H01L 27/11* (2006.01)

(52) U.S. Cl.
CPC .... *H01L 21/823431* (2013.01); *H01L 27/1104* (2013.01)

(58) Field of Classification Search
CPC .................. H01L 29/66795; H01L 21/76232; H01L 29/785; H01L 21/76; H01L 21/823431; H01L 21/84; H01L 27/1203; H01L 29/7851; H01L 21/8221; H01L 27/0688; H01L 27/11; H01L 27/1104; H01L 29/7853; H01L 29/07
See application file for complete search history.

(56) References Cited

U.S. PATENT DOCUMENTS

2005/0239242 A1* 10/2005 Zhu et al. ...................... 438/199
2005/0255656 A1   11/2005 Kang et al.
(Continued)

FOREIGN PATENT DOCUMENTS

| CN | 1885562 A | 12/2006 |
|---|---|---|
| CN | 101261991 A | 10/2008 |

(Continued)

OTHER PUBLICATIONS

"International Application Serial No. PCT/CN2011/082519, International Preliminary Report on Patentability dated Mar. 25, 2014", (w/ English Translation), 18 pgs.

(Continued)

*Primary Examiner* — Meiya Li
(74) *Attorney, Agent, or Firm* — Schwegman Lundberg & Woessner, P.A.

(57) ABSTRACT

A SRAM cell and a method for manufacturing the same are disclosed. In one embodiment, the SRAM cell may include: a semiconductor layer; and a first Fin Field Effect Transistor (FinFET) and a second FinFET formed on the semiconductor layer, wherein the first FinFET includes a first fin formed by patterning the semiconductor layer, the first fin having a first top surface and a first bottom surface, wherein the second FinFET includes a second fin formed by patterning the semiconductor layer, the second fin having a second top surface and a second bottom surface, and wherein the first top surface is substantially flush with the second top surface, the first and second bottom surfaces abut against the semiconductor layer, and the height of the second fin is greater than the height of the first fin.

4 Claims, 19 Drawing Sheets

(56) References Cited

U.S. PATENT DOCUMENTS

| | | |
|---|---|---|
| 2006/0151834 A1 | 7/2006 | Anderson et al. |
| 2009/0321834 A1 | 12/2009 | Rachmady et al. |
| 2011/0169101 A1 | 7/2011 | Doornbos et al. |

FOREIGN PATENT DOCUMENTS

| | | |
|---|---|---|
| CN | 101877311 A | 11/2010 |
| CN | 102074582 A | 5/2011 |
| CN | 102956702 A | 3/2013 |
| WO | WO-2013040833 A1 | 3/2013 |

OTHER PUBLICATIONS

"International Application Serial No. PCT/CN2011/082519, International Search Report mailed Jun. 21, 2012", (w/ English Translation), 8 pgs.

"International Application Serial No. PCT/CN2011/082519, Written Opinion mailed Jun. 21, 2012", (w/ English Translation), 12 pgs.

"Chinese Application Serial No. 201110282569.8, Office Action mailed Oct. 27, 2014", 18 pgs.

\* cited by examiner (A)

(B)

(C)

(A)

(B)

(C)

(A)

(B)

(C)

SRAM CELL AND METHOD FOR MANUFACTURING THE SAME

CROSS REFERENCE TO RELEVANT APPLICATION(S)

This application is a National Phase application of, and claims priority to, PCT Application No. PCT/CN2011/082519, filed on Nov. 21, 2011, entitled "SRAM CELL AND METHOD FOR MANUFACTURING THE SAME", which claimed claims priority to the Chinese Application No. 201110282569.8, entitled "SRAM CELL AND METHOD FOR MANUFACTURING THE SAME", filed on Sep. 21, 2011, both the PCT Application and Chinese Application are incorporated herein by reference in their entireties.

TECHNICAL FIELD

The present disclosure relates to the semiconductor field, and more particularly, to a Static Random Access Memory (SRAM) cell and a method for manufacturing the same, wherein the SRAM cell comprises Fin Field Effect Transistors (FinFETs) which comprise respective fins having different heights.

BACKGROUND

Fin Field Effect Transistors (FinFETs) are increasingly used in a variety of applications due to their faster switching speed, higher current density and better control of short channel effects over conventional transistors. In a typical FinFET, the channel is provided within a semiconductor fin. The fin generally comprises a single-crystalline semiconductor material with a substantially rectangular cross-section. The fin usually has a height greater than its width, so as to achieve a relatively higher on-current per unit area.

While providing improved performances over conventional Metal Oxide Semiconductor Field Effect Transistors (MOSFETs), FinFETs, however, introduce some design challenges. Specifically, the conventional MOSFETs have almost no limit on the device width, while the FinFETs generally comprise respective fins having a substantially same height. In other words, for control of the on-current and the off-current of transistors, the conventional MOSFETs provide two parameters, the width W and the length L of the channel, but the FinFETs provide only one parameter, the length L of the channel, because the height of the fin and thus the width of the cannel is fixed for all the FinFETs. Therefore, for a given transistor length L, which defines a ratio of the on-current to the off-current, the amount of the on-current from an individual fin is fixed.

However, transistors with different on-currents are often required in high performance Integrated Circuits. One such example is a 6-transistor Static Random Access Memory (SRAM) cell, wherein a ratio of the on-current of a pull-down transistor to the on-current of a pass gate transistor (that is, the β ratio) needs to be kept close to 2 for optimal performances of the SRAM cell.

FIG. 1 is a top view showing a conventional 6-transistor SRAM cell by way of example. As shown in FIG. 1, on a semiconductor substrate, active regions 103, gate electrodes 104 and a first level of metal wiring 105 are provided. The SRAM cell includes 6 transistors: a first pull-up P-type Field Effect Transistor (PFET) 110, a first pull-down N-type Field Effect Transistor (NFET) 120, a first pass gate NFET 130, a second pull-up PFET 111, a second pull-down NFET 121, and a second pass gate NFET 131. Here, the first pull-down NFET 120 and the corresponding first pass gate NFET 130 have respective active regions of different widths, to keep the β ratio around 2. Further, the width ratio of the widths for pull-down NFETs 120 and 121 to the pull-up PFETs 110 and 111 is also around 2, so as to give a current ratio (the γ ratio) of the pull-down NFETs 120 and 121 to the pull-up PFETs 110 and 111 around 4.

Typically, FinFETs comprise respective fins having a substantially same height. This is because the physical heights of the fins in different FinFETs need to be maintained the same to facilitate lithographic patterning of the fins. Furthermore, unlike conventional MOSFETs, an increase in the physical widths of the fins does not result in a corresponding increase in the channel width (or an increased current), because the channel is on the sidewalls of the respective fins. Therefore, to form a 6-transistor SRAM cell by means of FinFETs, some measures must be taken to maintain the β ratio of about 2 and/or the γ ratio of about 4.

A first solution is to use two fins for one pull-down NFET and only one fin for one pass gate NFET. This results in an increased layout area for the SRAM cell. A second solution is to weaken the pass gate NFETs by making the channel length longer. Specifically, the channel length can be made longer by making gate electrodes for the pass gate NFETs wider, for example. As a result, the on-current is reduced. Also, this results in an increased layout area for the SRAM cell. A third solution is to weaken the pass gate NFETs by reducing the height of the fins. This will not increase the layout area for the SRAM cell, because only the vertical dimension is changed. However, presently, there is no efficient way to change the fin height.

Therefore, there is a need for a SRAM cell and a method for manufacturing the same, wherein FinFETs constituting the SRAM cell can comprise respective fins having different heights.

SUMMARY

The present disclosure provides, among other things, a SRAM cell and a method for manufacturing the same, by which it is possible to provide fins of different heights in a easy and feasible way.

According to an embodiment, there is provided a SARM cell, comprising: a semiconductor layer; and a first FinFET and a second FinFET formed on the semiconductor layer, wherein the first FinFET comprises a first fin formed by patterning the semiconductor layer, the first fin having a first top surface and a first bottom surface, wherein the second FinFET comprises a second fin formed by patterning the semiconductor layer, the second fin having a second top surface and a second bottom surface, and wherein the first top surface is substantially flush with the second top surface, the first and second bottom surfaces abut against the semiconductor layer, and the height of the second fin is greater than the height of the first fin.

According to a further embodiment, there is provided a method for manufacturing a SRAM cell comprising a first FinFET and a second FinFET, the method comprising: patterning a semiconductor layer in a first region and a second region of the semiconductor layer, respectively, to form a first fin and a second fin, wherein the first fin has a first top surface and a first bottom surface and the second fin has a second top surface and a second bottom surface; forming the first and second FinFETs based on the first and second fins, respectively, wherein the first top surface is substantially flush with the second top surface, the first and second bottom surfaces abut against the semiconductor layer, and the height of the second fin is greater than the height of the first fin.

According to some embodiments, it is possible to provide fins of different heights by etching a semiconductor layer to different depths. As a result, it is possible to effectively integrate transistor devices having different current drive capabilities in a SRAM cell.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
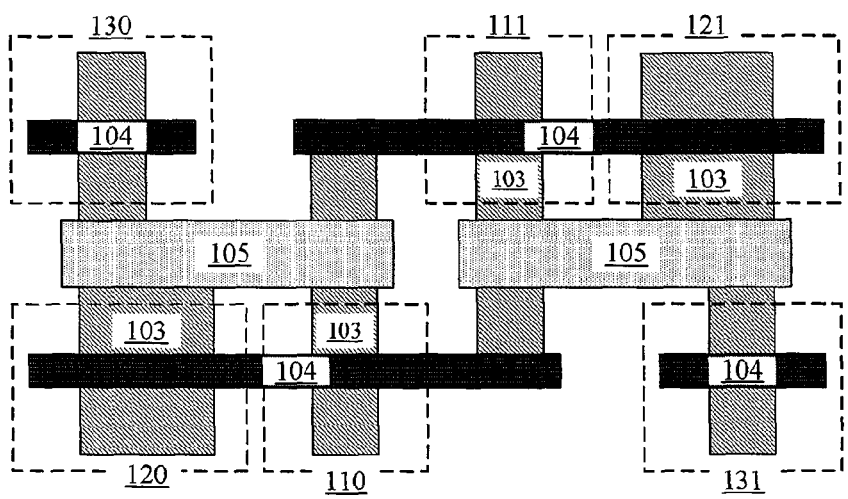
FIG. 1 is a top view showing a conventional 6-transistor SRAM cell.

Hereinafter, descriptions are given with reference to embodiments shown in the attached drawings. However, it is to be understood that these descriptions are only illustrative, and are not intended to limit the present disclosure. Further, in the following, known structures and technologies are not described to avoid obscuring the present disclosure unnecessarily.

In the drawings, various layer structures according to the embodiments are shown. However, they are not drawn to scale, and some features may be enlarged while some features may be omitted for the sake of clarity. Moreover, shapes, sizes, and relative positions of regions and layers shown in the drawings are also illustrative only, and deviations may occur due to manufacture tolerances and technique limitations in practice. Those skilled in the art can also devise regions/layers of other different shapes, sizes, and relative positions as desired.

The following descriptions are given with respect to Si based materials, by way of example. However, it is to be understood that the present disclosure is not limited to the Si based materials, and is also applicable to other semiconductor materials.

Figure 2:
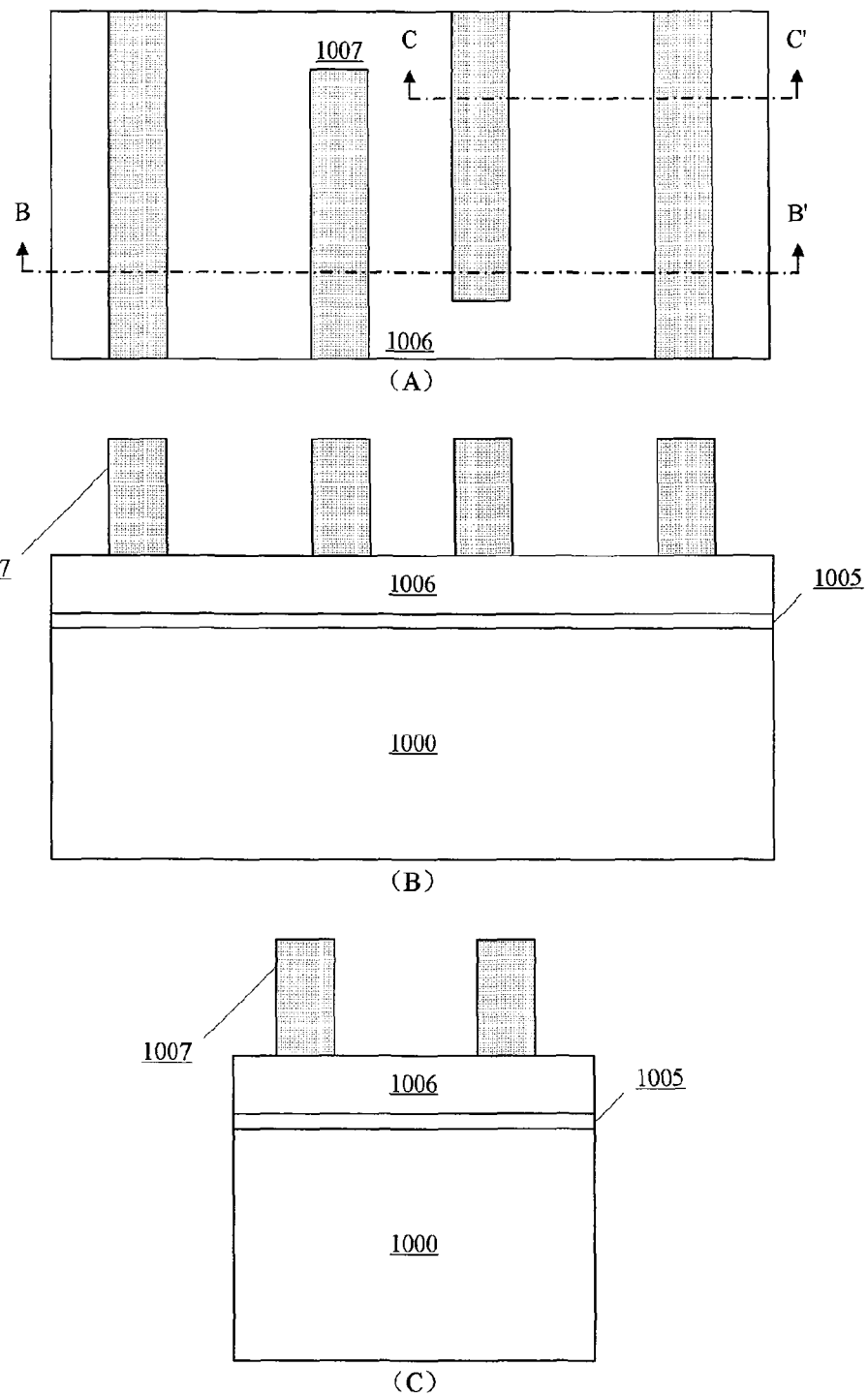
FIGS. 2-16 are schematic views showing structures obtained in different steps in a flow of manufacturing a semiconductor structure according to an embodiment of the present disclosure, wherein (A) is a top view, (B) is a cross-section view taken along line B-B', and (C) is a cross-section view taken along line C-C'.

As shown in FIG. 2, a semiconductor layer 1000, for example, a bulk Si semiconductor layer, is provided. The semiconductor layer 1000 may be a substrate such as a semiconductor substrate, or a semiconductor layer formed on a substrate. On the semiconductor layer 1000, a hard mask layer, which, for example, includes an oxide layer (e.g., silicon oxide) 1005 and a nitride layer (e.g., silicon nitride) 1006, is formed. The oxide layer 1005 and the nitride layer 1006 may be formed on the semiconductor layer by means of deposition. For example, the oxide layer 1005 may have a thickness of about 2-5 nm, and the nitride layer 1006 may have a thickness of about 10-50 nm.

A photo resist layer 1007 is coated on the above structure, and then is patterned to correspond to a fin pattern to be formed. Specifically, in an example of 6-transistor SRAM cell, the photo resist layer 1007 can be patterned into 4 bars. As shown in FIG. 2, from left to right, the 4 bars can be arranged: one corresponding to respective fins of a first pull-down NFET (referring to 120 shown in FIG. 1) and a first pass gate NFET (referring to 130 shown in FIG. 1) (the two fins being connected together in practice, as will be described in the following), one corresponding to a fin of a first pull-up PFET (referring to 110 shown in FIG. 1), one corresponding to a fin of a second pull-up PFET (referring to 111 shown in FIG. 1), and one corresponding to respective fins of a second pull-down NFET (referring to 121 shown in FIG. 1) and a second pass gate NFET (referring to 131 shown in FIG. 1) (the two fins being connected together in practice, as will be described in the following), respectively.

Figure 3:
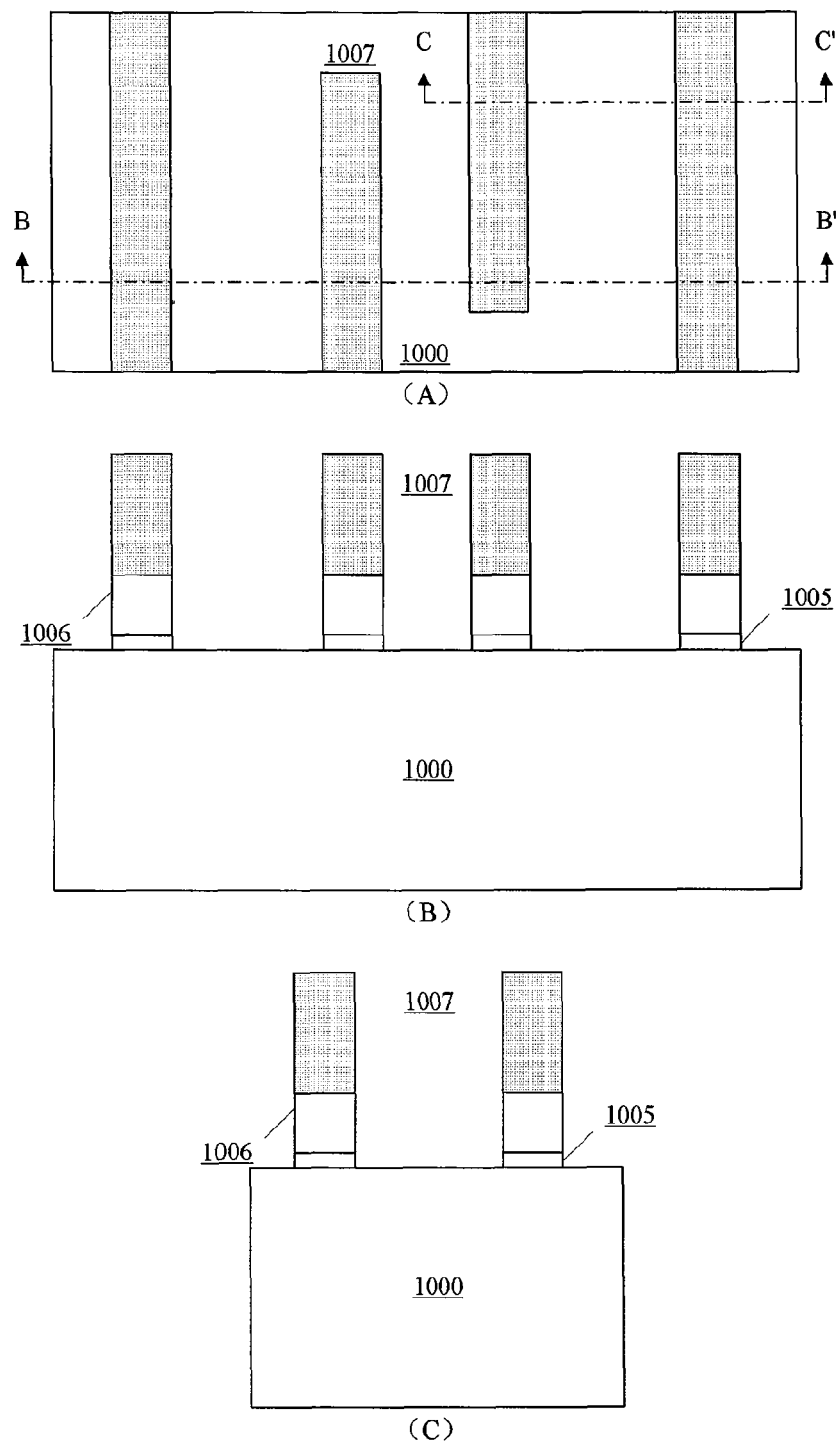

Then, as shown in FIG. 3, the hard mask layer (including the oxide layer 1005 and the nitride layer 1006) is patterned using the patterned photo resist layer 1007 as a mask. The patterning may be conducted by means of Reactive Ion Etching (RIE), for example. After that, the photo resist layer 1007 can be removed.

After the hard mask layer is patterned, the semiconductor layer 1000 may be patterned using the patterned hard mask layer (including the oxide layer 1005 and the nitride layer 1006) as a mask to form the respective fins. According to an embodiment, it is possible to etch the semiconductor layer to different depths in different regions thereof, so as to achieve fins having different heights.

Figure 4:
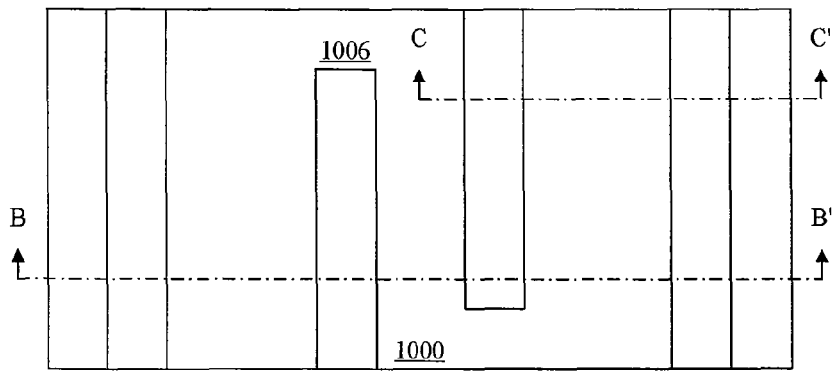
Figure 4:
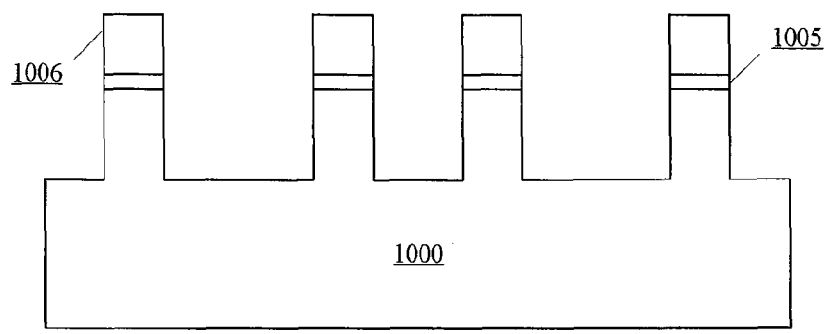
Figure 4:
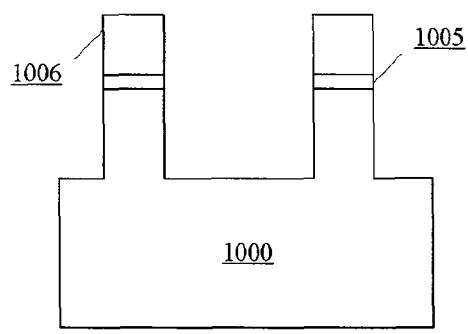

Specifically, as shown in FIG. 4, firstly the semiconductor layer 1000 is patterned using the patterned hard mask layer (including the oxide layer 1005 and the nitride layer 1006) as a mask by means of, for example, RIE, to a depth of about 30-150 nm. Here, the etching depth can be controlled by means of process parameters adopted in the RIE process such as ion energy, etching time and the like. In the patterned semiconductor layer 1000, fins having a first height are formed. Specifically, the upper portion of the leftmost bar shown in FIG. 4(A) corresponds to the fin of the first pass gate NFET (referring to 130 shown in FIG. 1), the second bar from left shown in FIG. 4(A) corresponds to the fin of the first pull-up PFET (referring to 110 shown in FIG. 1), the second bar from right shown in FIG. 4(A) corresponds to the fin of the second pull-up PFET (referring to 111 shown in FIG. 1), and the lower portion of the rightmost bar shown in FIG. 4(A) corresponds to the fin of the second pass gate NFET (referring to 131 shown in FIG. 1). These fins have a height corresponding to the height of recess or the extent of etching of the semiconductor layer 1000 in this patterning process, for example, about 30-150 nm.

Figure 5:
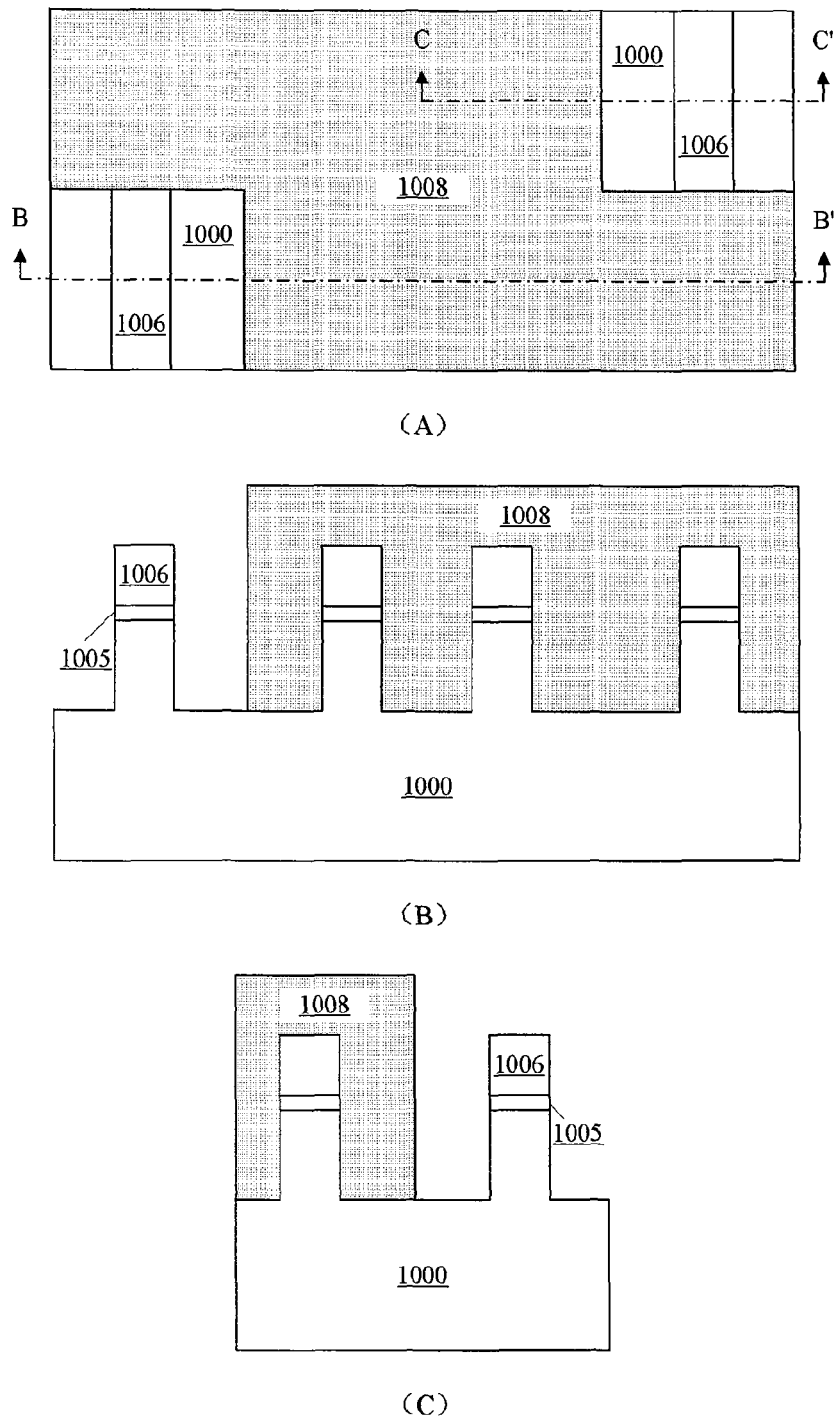

Next, as shown in FIG. 5, a mask layer such as a photo resist layer 1008 is formed to cover the structure shown in FIG. 4, and then is patterned to only expose regions corresponding to the pull-down transistors (referring to 120 and 121 shown in FIG. 1).

Figure 6:
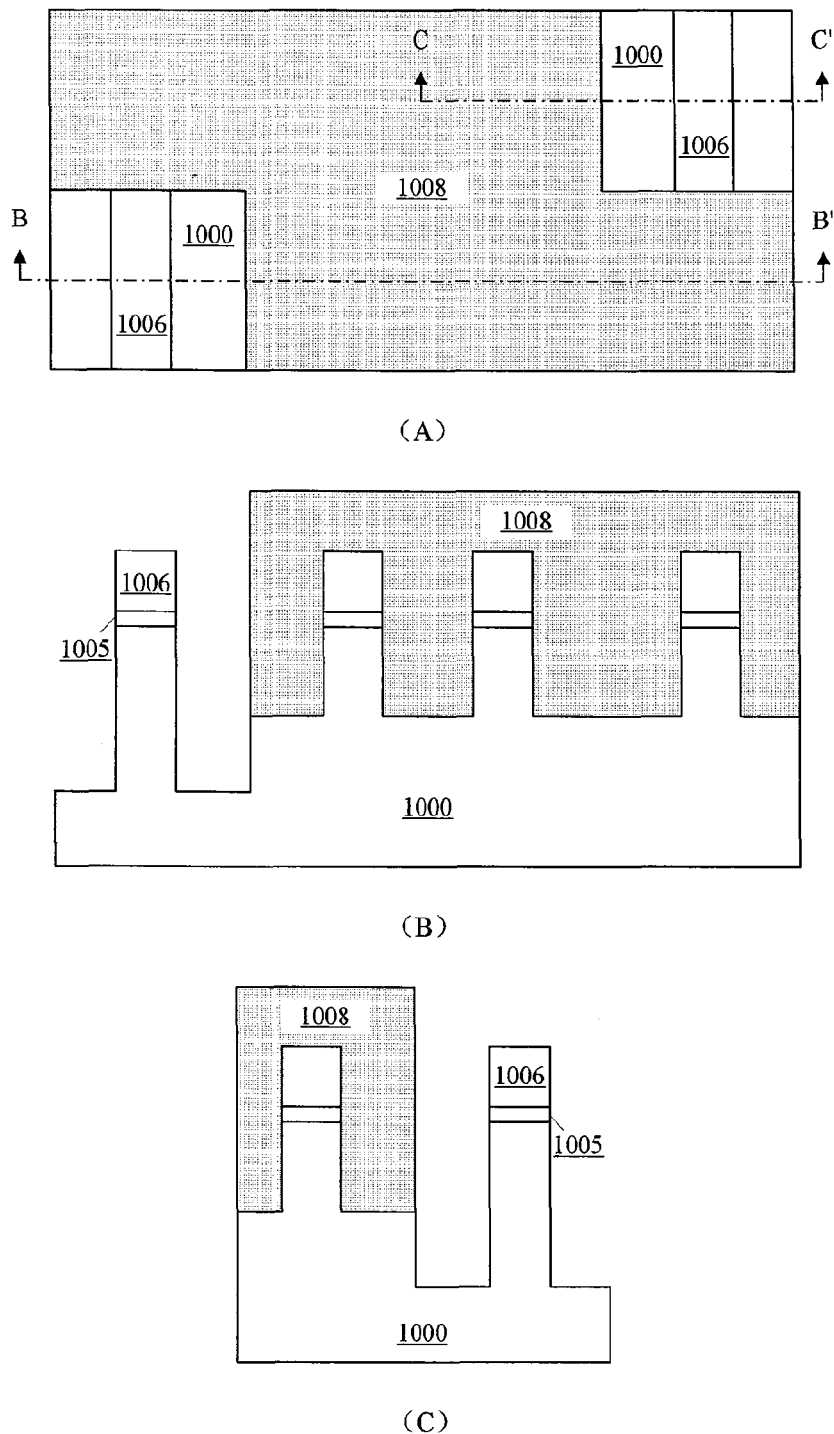

Subsequently, as shown in FIG. 6, the semiconductor layer 1000 in the exposed regions is further patterned using the patterned mask layer 1008 as a mask by means of, for example, RIE, to increase the height of the fins in those regions. For example, in the regions of the pull-down transistors, the semiconductor layer 1000 is further etched off by a thickness of about 30-150 nm. After that, the mask layer 1008 can be removed.

Thus, fins having a second height are formed. Specifically, the lower portion of the leftmost bar shown in FIG. 6(A) corresponds to the fin of the first pull-down NFET (referring to 120 shown in FIG. 1), and the upper portion of the rightmost bar shown in FIG. 6(A) corresponds to the fin of the second pull-down NFET (referring to 121 shown in FIG. 1). These two fins have a height (that is, the second height) corresponding to the height of recess or the extent of etching of the semiconductor layer 1000 in the regions of the pull-down transistors (in this example, the height of the two fins is the sum of the etching depths in the two patterning processes), for example, about 60-300 nm.

Thus, an arrangement where fins have different heights is formed. Specifically, as shown in FIG. 6, in the example of 6-transistor SRAM cell, in the regions corresponding to the pull-up transistors and the pass gate transistors, the fins having the first height are formed; while in the regions corresponding to the pull-down transistors, the fins having the second height are formed. That is, the pull-down transistors have respective fins which are greater in height, and thus each have a larger channel width to provide a larger on-current.

According to this embodiments, it is possible to form fins of different heights in a semiconductor layer by selectively patterning the semiconductor layer to different depths in different regions of the semiconductor layer.

Here, it is to be noted that in the context of the present disclosure a "height" of a fin refers to an extent from a top surface of the fin to a bottom surface of the fin (that is, the bottom surface is a surface of the semiconductor layer against which the fin abuts). For example, in the example shown in FIG. 6, in the regions of the pull-up transistors and the pass gate transistors, the height of the fins is the extent from the top surface of the semiconductor layer 1000 (i.e., the top surface of the fins in these regions) to a surface of the semiconductor layer 1000 in portions of these regions other than the fins; and in the regions of the pull-down transistors, the height of the fins is the extent from the top surface of the semiconductor layer 1000 (i.e., the top surface of the fins in these regions) to a surface of the semiconductor layer 1000 in portions of these regions other than the fins.

Here, the term "abut against" or "abutting against" refers to the fact that the fin directly contacts the semiconductor layer, without any intervening layers. There may also be such a situation in which the semiconductor layer has an underlying layer such as a substrate. In this situation, a fin can extend through the whole semiconductor layer (that is, the fin having such a thickness is formed from the semiconductor layer in its entire thickness). Then, the bottom surface of the fin is at the same level with the bottom surface of the semiconductor layer. In the context of the present disclosure, this situation is also considered as the fin "abuts against" the semiconductor layer because there is no intervening layer between the fin and the semiconductor layer.

According to this embodiment, the respective top surfaces of the fins are substantially flushed with each other for convenience of subsequent processes, but can have different heights due to the different levels of the respective surfaces of the semiconductor layer in the respective regions where the respective fins are positioned.

After the fins having different heights are formed as described above, subsequent processes can be conducted to form final devices.

According to a further embodiment, a block region may be formed at the bottom of each of the fins, so as to at least partially suppress current leakage between source and drain regions of the respective final FinFETs through the bottom of the respective fins. Preferably, for an NFET, the block region may be p-type doped; while for a PFET, the block region may be n-type doped.

Figure 7:
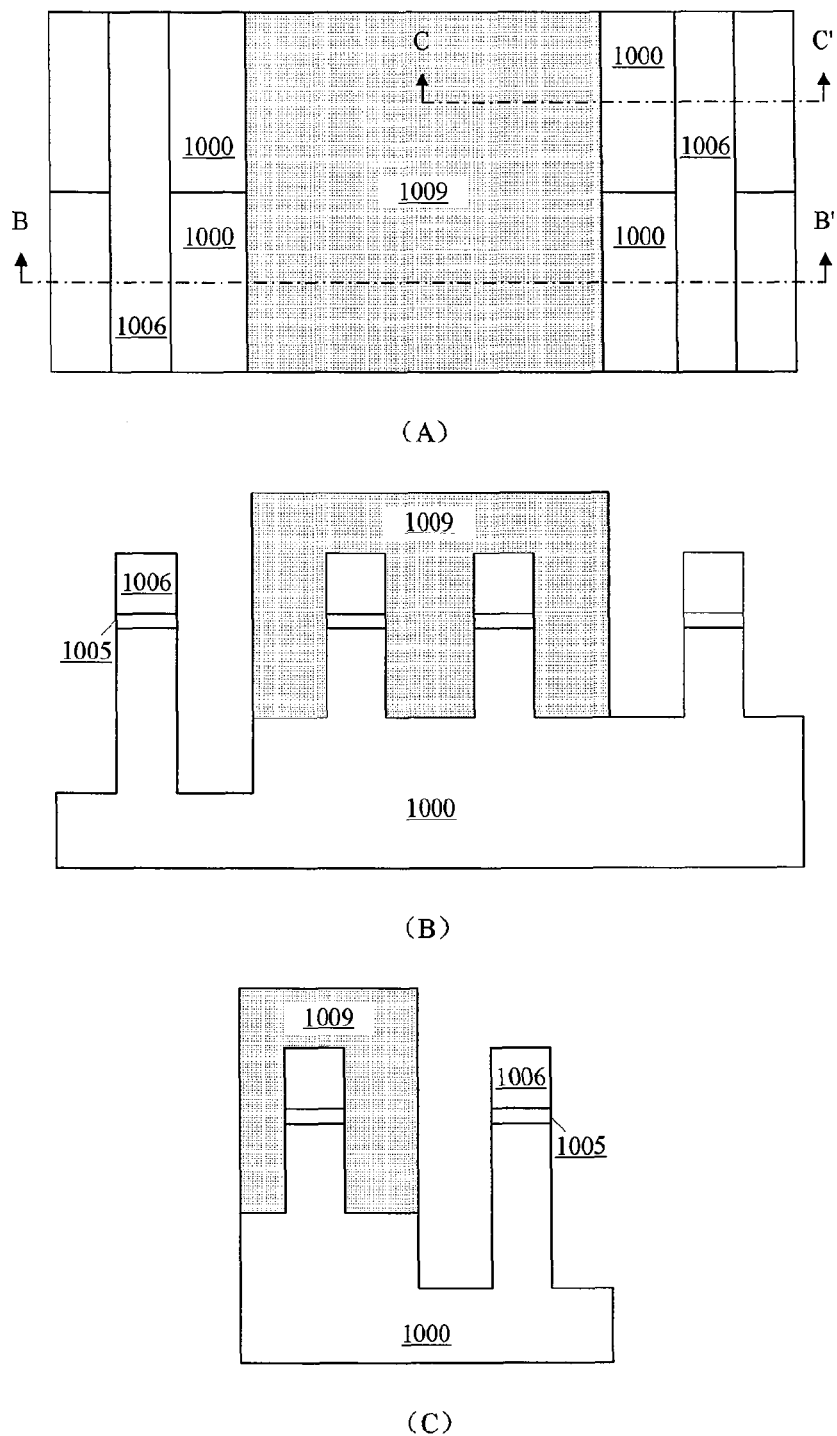

Specifically, as shown in FIG. 7, a mask layer such as a photo resist layer 1009 is formed, and then is patterned to cover the PFET regions. Next, as indicated by arrows in FIG. 8, ion implantation is conducted on the NFET regions to implant dopants for formation of the block region into the semiconductor layer. Here, the dopants are preferably p-type dopants such as B or $BF_2$. Then, the mask layer 1009 can be removed. Due to the presence of the hard mask layer, especially, the nitride layer 1006, the implantation is self-aligned to both sides of the respective fins.

Figure 9:
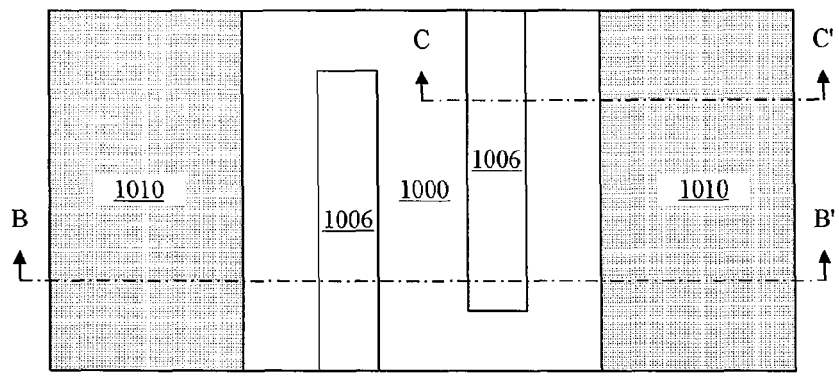
Figure 9:
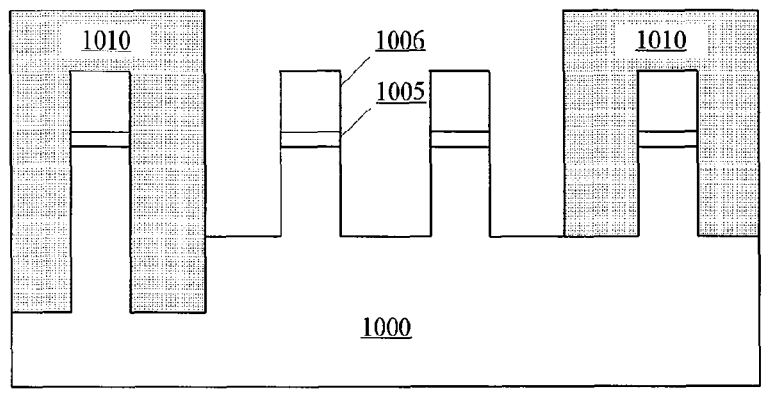
Figure 9:
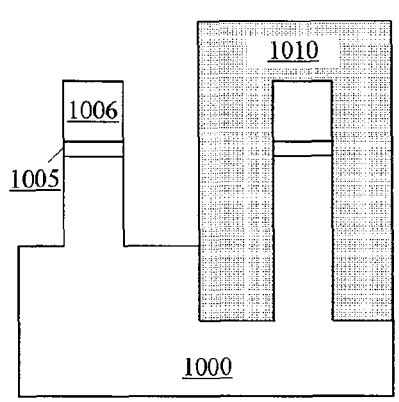

Likewise, as shown in FIG. 9, a mask layer such as a photo resist layer 1010 is formed, and then is pattered to cover the NFET regions. Next, as indicated by arrows in FIG.10 ion implantation is conducted in the PFET regions to implant dopants for formation of the block region into the semiconductor layer. Here, the dopants are preferably n-type dopants such as P of As. Then, the mask layer 1010 can be removed. Due to the presence of the hard mask layer, especially, he nitride layer 1006, the implantation is self-aligned to both sides of the respective fins.

Figure 8:
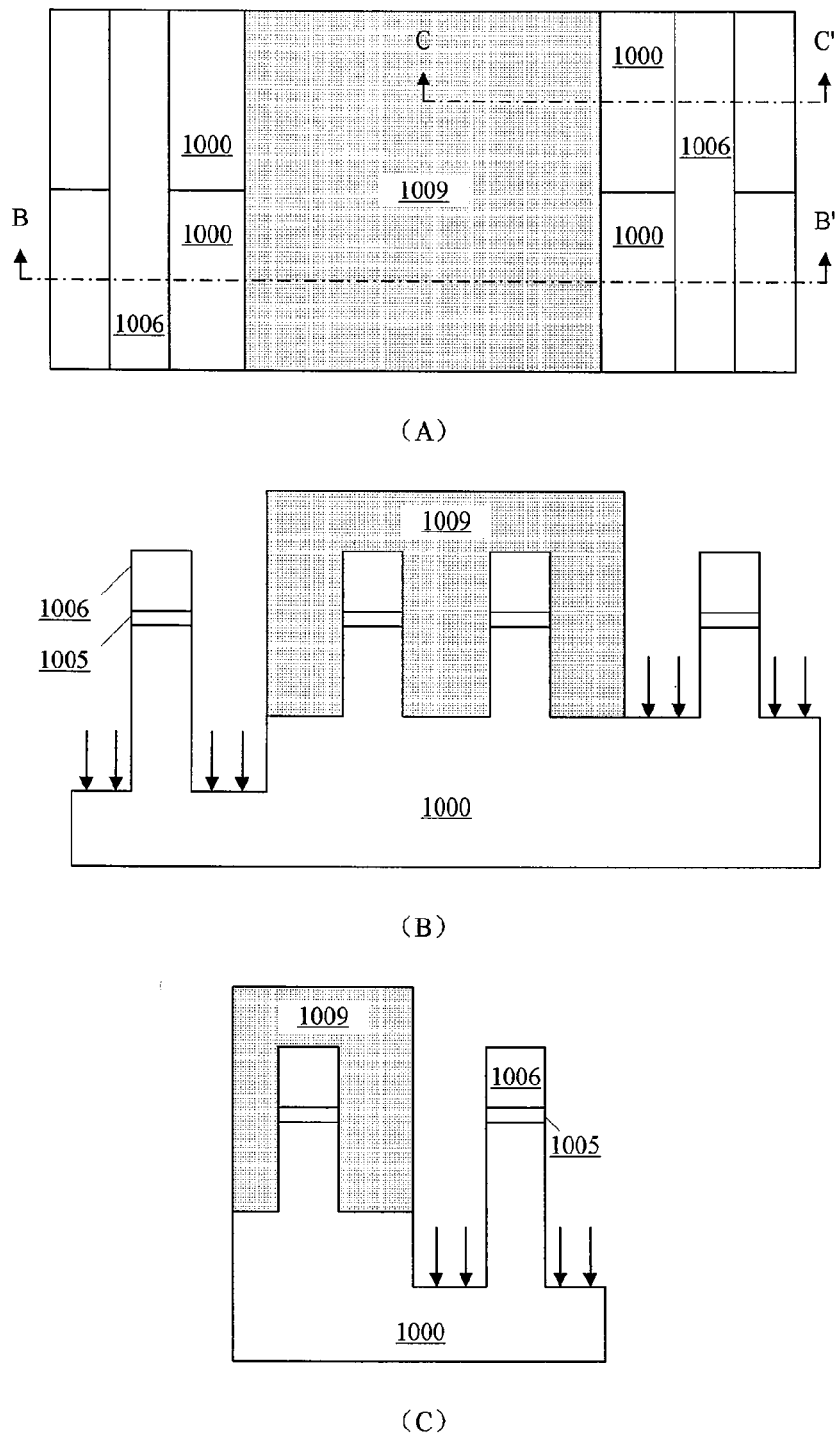
Figure 10:
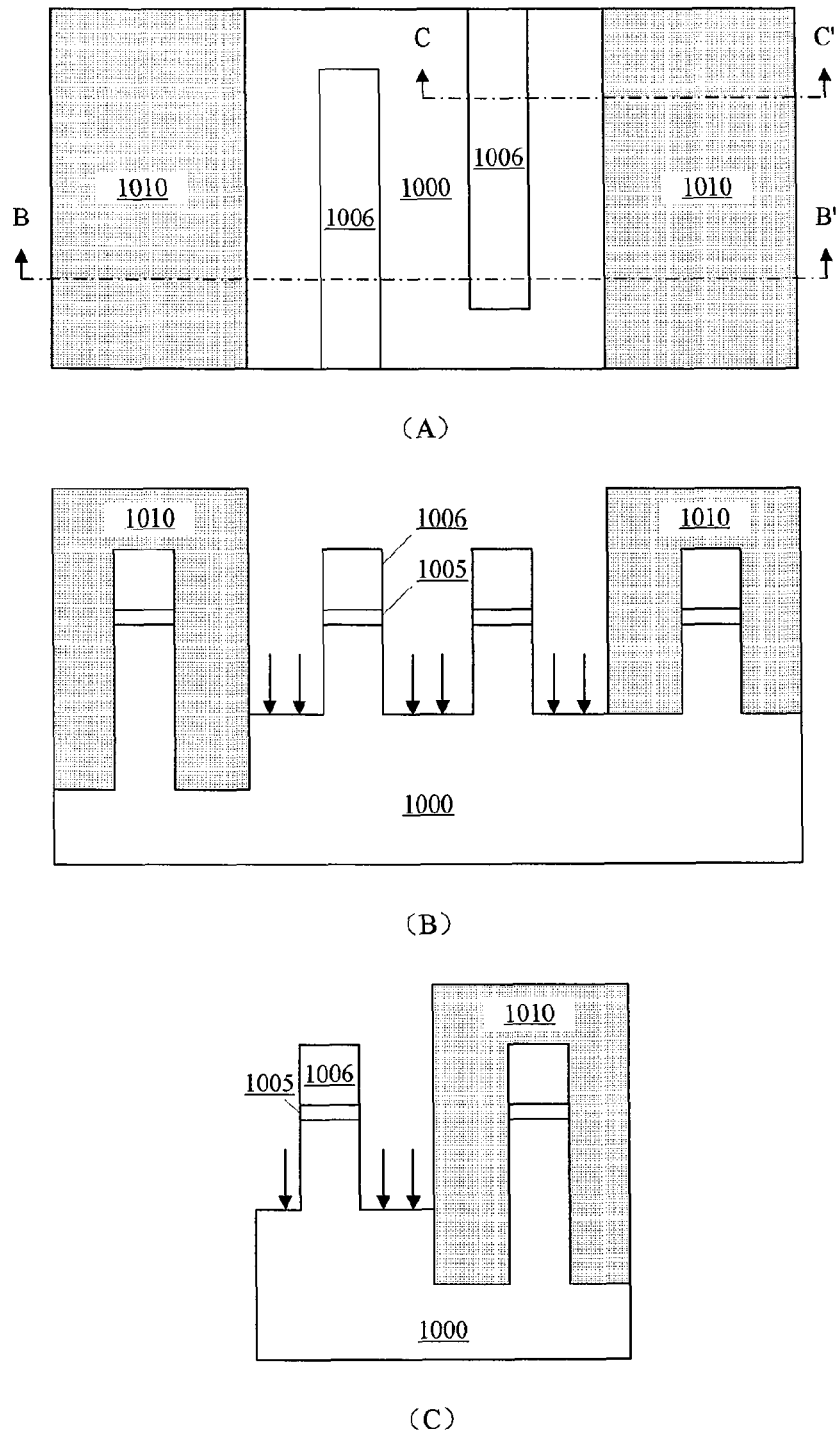

Here, it is to be noted that the process shown in FIGS. 7 and 8 and the process shown in FIGS. 9 and 10 can be exchanged in order.

Figure 11:
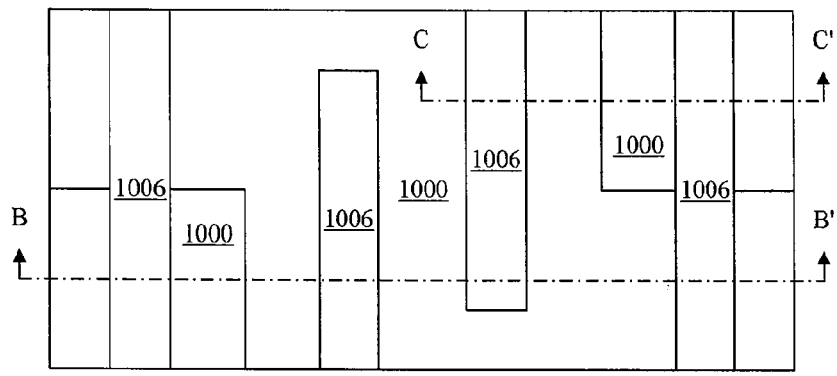
Figure 11:
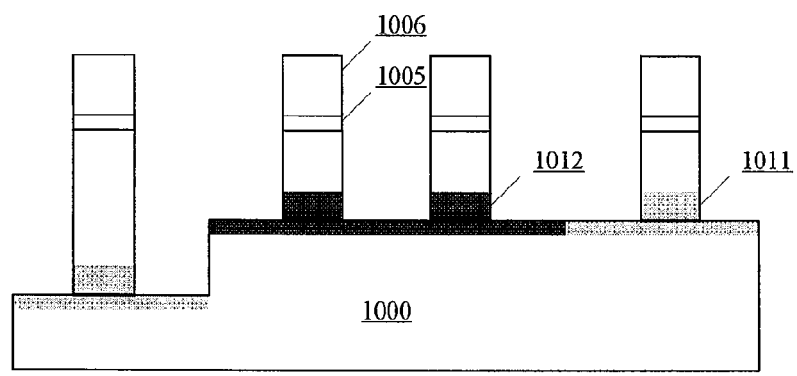
Figure 11:
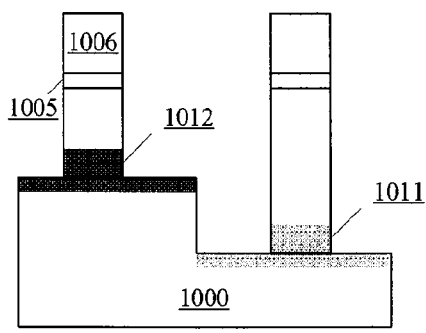

After the implantation for the block regions as described above, the implanted dopants can be activated by annealing, so that the dopants can diffuse into the bottom of the respective fins to form the block regions. The formed block regions may have a doping concentration of about $1 \times 10^{16}$ $cm^{-3}$-$1 \times 10^{19}$ $cm^{-3}$. As shown in FIG. 11, p-type doped block regions 1011 are formed in the NFET regions, while n-type doped block regions 1012 are formed in the PFET regions. It is to be noted that the block regions 1011 and 1012 may have boundaries which are not sharp. In the drawings, the block regions 1011 and 1012 are shown to have straight and definite boundaries for convenience.

Next, isolation layers can be formed on both sides of the respective fins, and gate stacks can be formed on the isolation layers to cross over the respective fins, so as to complete the FinFETs.

Figure 12:
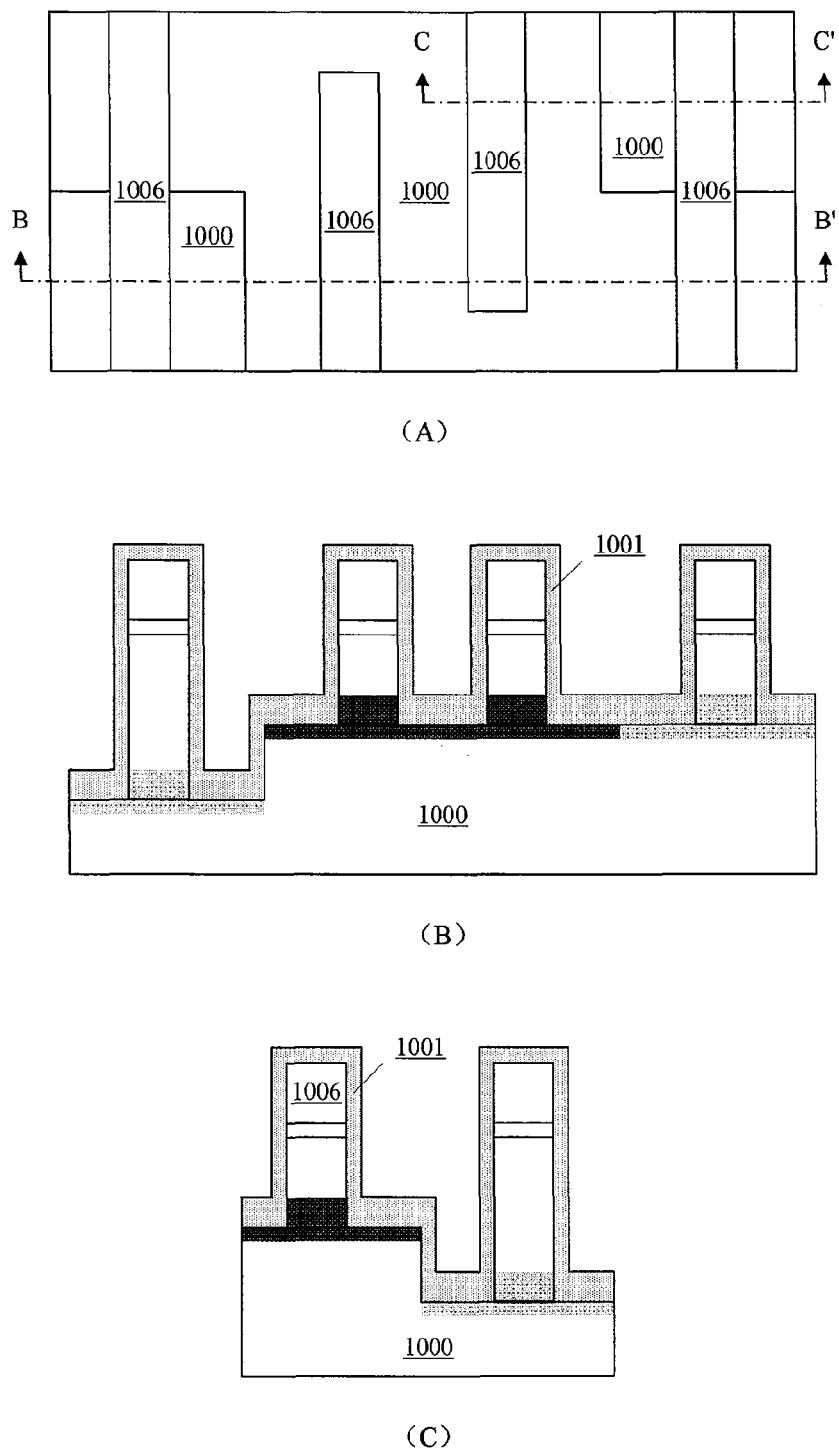
Figure 13:
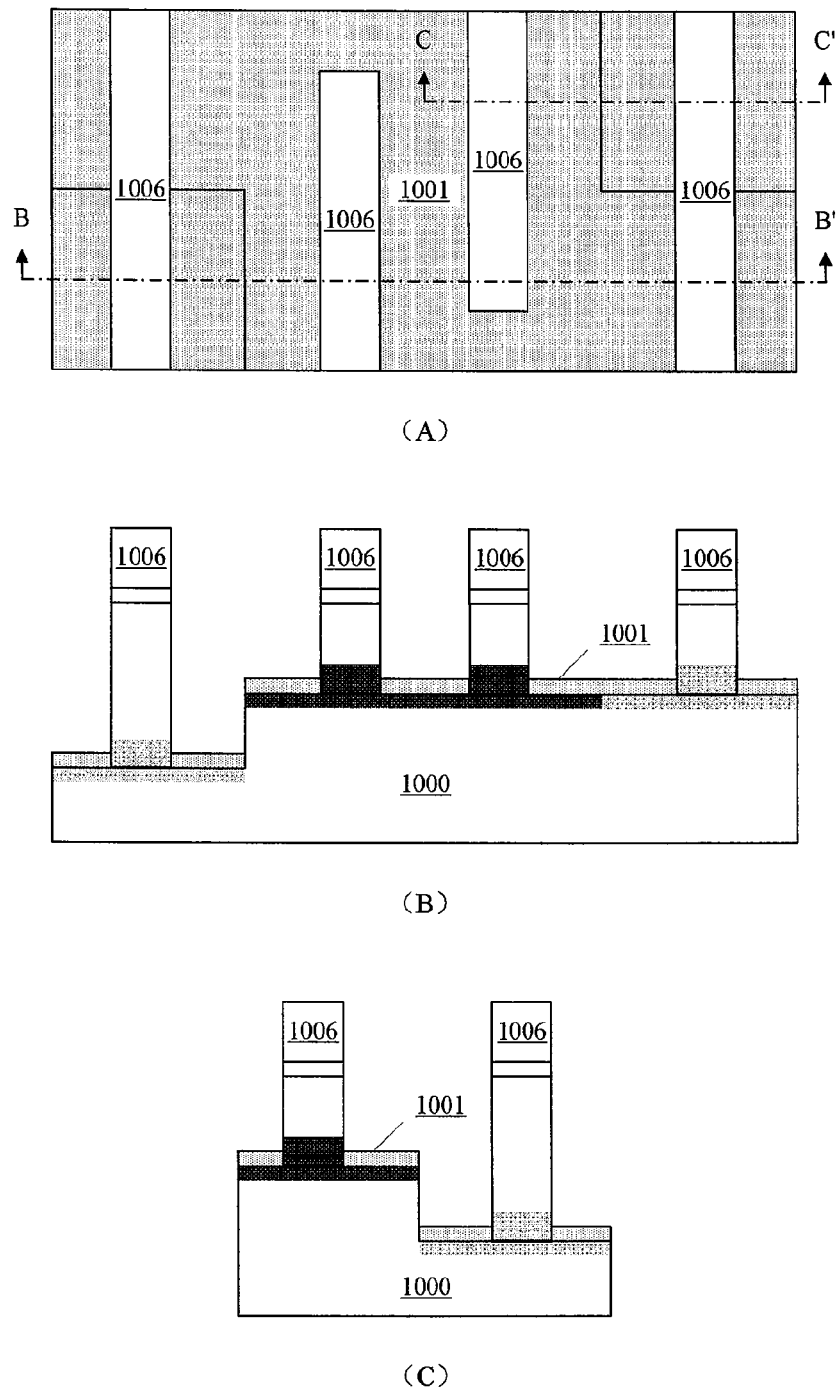

Specifically, as shown in FIG. 12, firstly, an oxide layer 1001, such as a High Density Plasma (HDP) oxide (e.g., $SiO_2$) layer, may be deposited on the whole structure. The oxide layer 1001 may have thicker bottom portion and thinner portions on sidewalls of the respective fins. It is to be noted that the oxide layer 1001 is not shown in the top view shown in FIG. 12(A) for sake of clarity. Next, as shown in FIG. 13, the oxide layer 1001 is isotropically etched back to expose the sidewalls of the fins, resulting in isolation layers 1001 located on both sides of the respective fins. It is to be noted that there may be still some materials from the isolation layers remained on the top surfaces of the fins (specifically, the top surface of the nitride layer 1006), although not shown.

Figure 14:
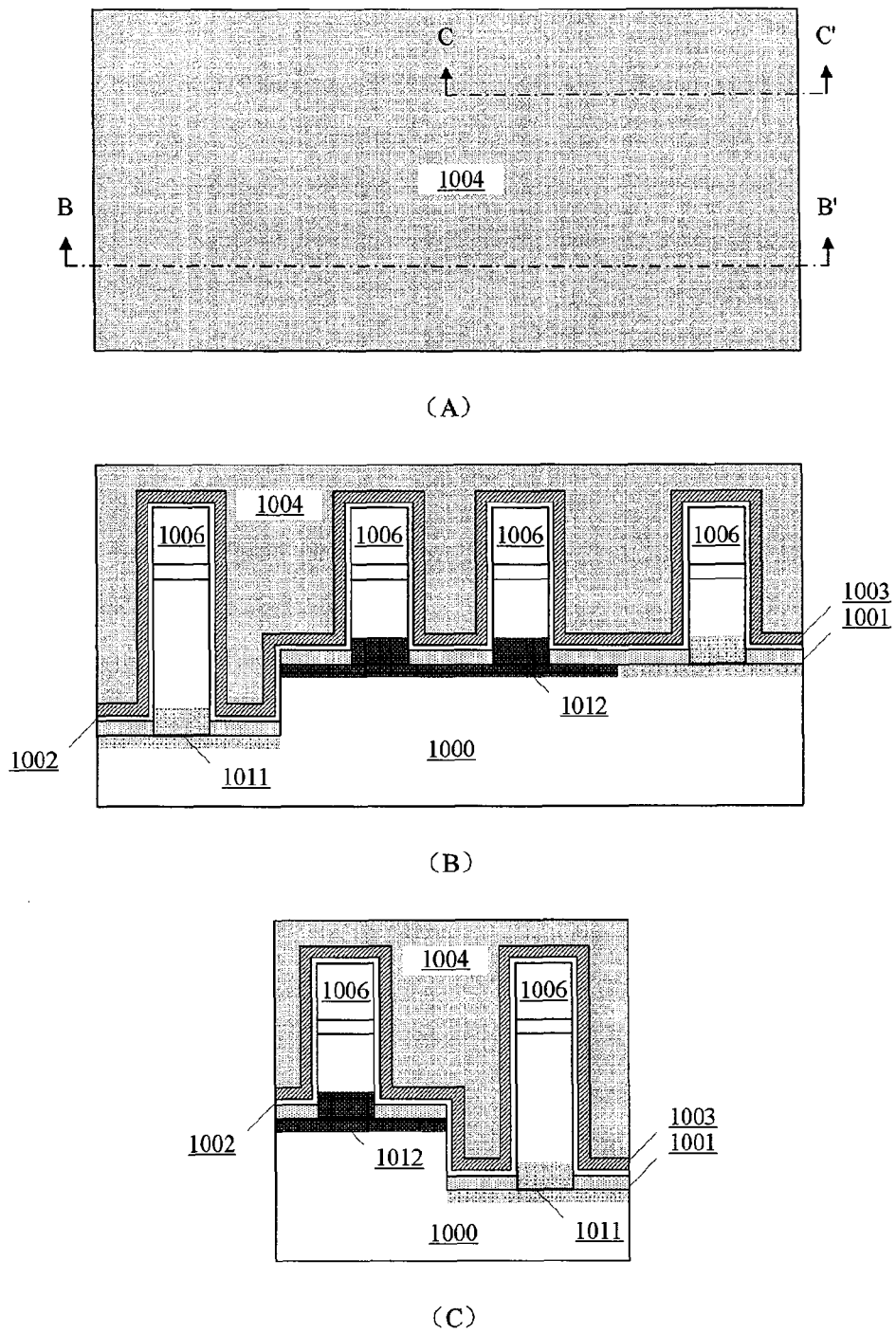

Then, the gate stacks can be formed on the isolation layers. Specifically, as shown in FIG. 14, a gate dielectric layer 1002 and a gate electrode layer 1004 can be sequentially deposited on the structure shown in FIG. 13. According to an embodiment, there may also be a work function adjustment layer 1003 interposed between the gate dielectric layer 1002 and the gate electrode layer 1004. Preferably, the gate dielectric layer 1002 may comprise high K gate dielectric, such as $HfO_2$, HfSiO, HfSiON, HfTaO, HfTiO, HfZrO, $Al_2O_3$, $La_2O_3$, $ZrO_2$, and LaAlO; the work function adjustment layer 1003 may comprise TiN, TiAlN, TaN, TaAlN, TaC, and the like; and the gate electrode layer 1004 may comprise poly silicon, or metal gate electrode material such as Ti, Co, Ni, Al, and W.

It is to be noted that in this embodiment the hard mask layers 1005, 1006 are kept on top of the fins (resulting in 2-gate devices). However, the present disclosure is not limited thereto, but is also applicable to 3-gate devices. For example, the hard mask layers 1005, 1006 on top of the fins can be removed, and thus the gate dielectric layer and the work function adjustment layer can be formed on three sidewalls of the respective fins (i.e., the left and right sidewalls and the top sidewall), resulting in 3-gate devices.

Figure 15:
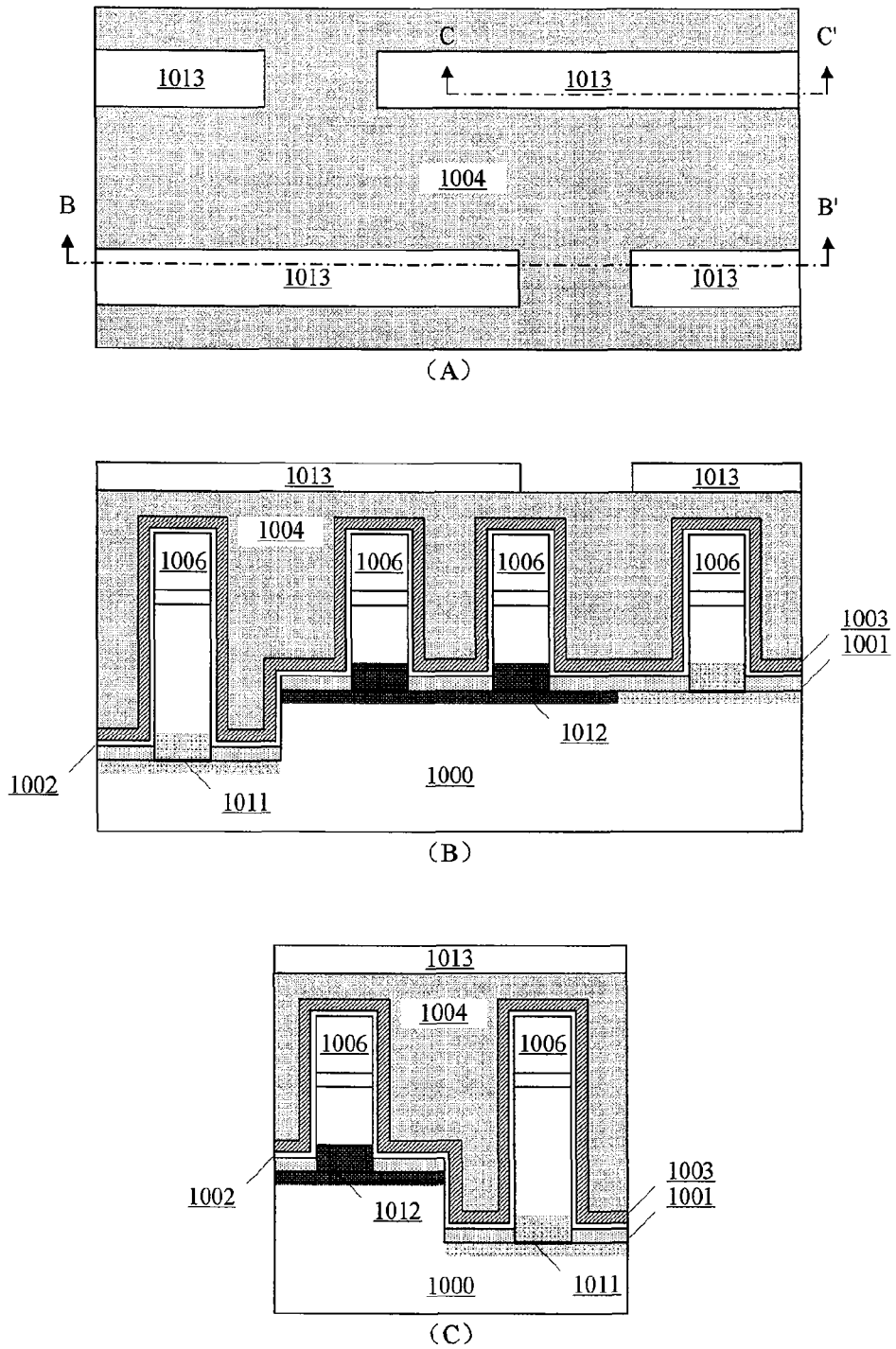
Figure 16:
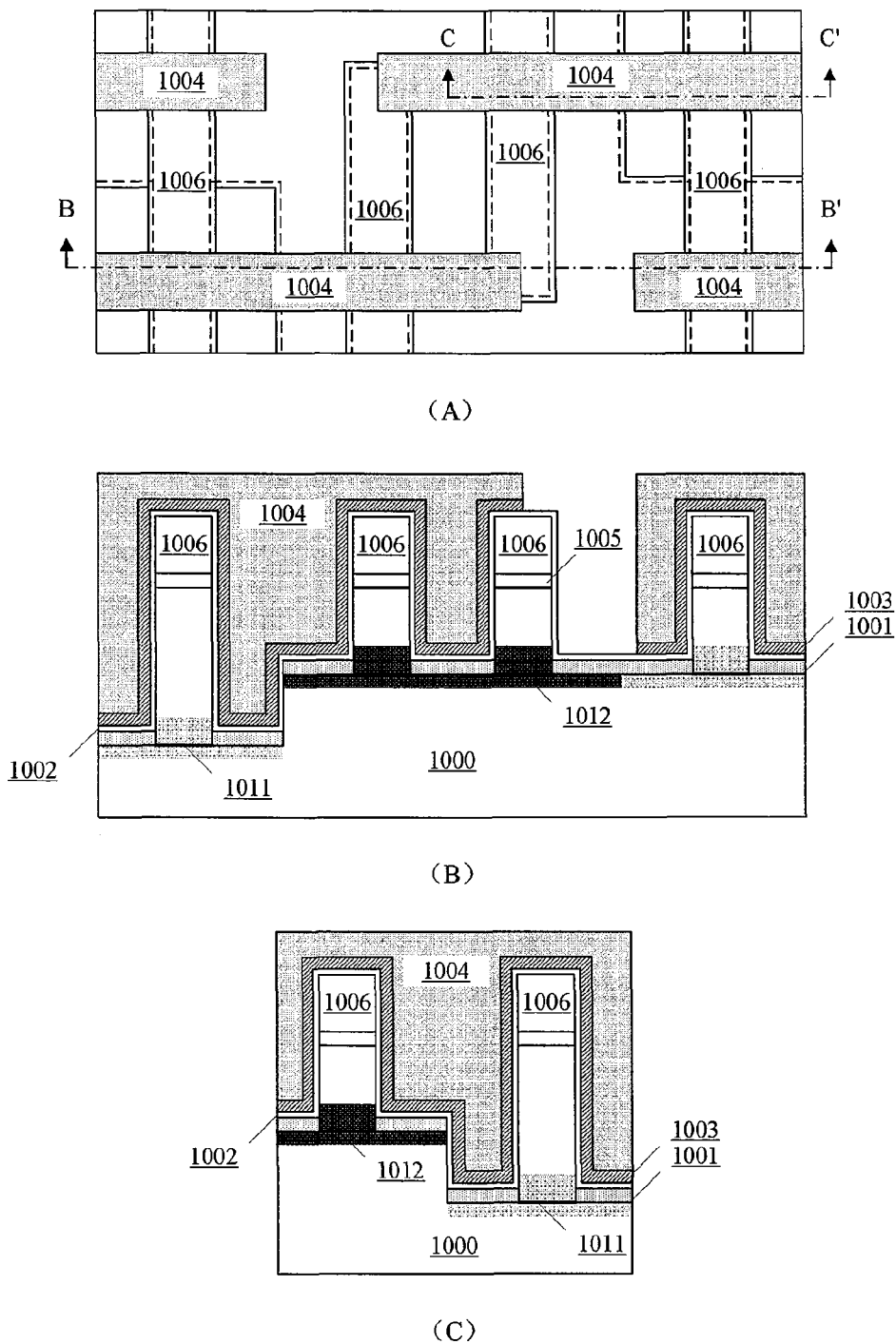

Next, as shown in FIG. 15, a photo resist layer 1013 is coated over the gate electrode layer 1004, and then is patterned into a pattern corresponding to gate electrodes to be formed. Specifically, in the example of 6-transistor SRAM cell, the photo resist layer 1013 can be patterned into 4 bars corresponding to the gate electrodes 104 shown in FIG. 1. Next, as shown in FIG. 16, the gate electrode layer 1004 and the work function adjustment layer 1003 are patterned with the patterned photo resist layer 1013 as a mask by means of, for example, RIE, to achieve the final gate stacks. Specifically, the gate electrode layer 1004 is firstly patterned by means of, for example, RIE, to leave portions thereof corresponding to the final gate electrodes, and then the work function adjustment layer 1003 is patterned by means of, for example, RIE, to remove portions thereof exposed outside the gate electrode layer. Optionally, the gate dielectric layer 1002 may be patterned by means of, for example, RIE, to remove portions thereof exposed outside the gate electrode layer. It is to be noted that in this process the gate dielectric layer 1002 can be left as it is without being patterned.

After the formation of the gate stacks, processes such as spacer formation, source/drain doping and activation, and metal contact formation can be conducted to achieve the final devices.

Thus, a SRAM cell according to an embodiment is achieved. As shown in FIG. 16, the SRAM cell may comprise a semiconductor layer, and a first FinFET and a second FinFET formed on the semiconductor layer. The first FinFET comprises a first fin which is formed in a first region of the semiconductor layer and abuts against the semiconductor layer, and the second FinFET comprises a second fin which is formed in a second region of the semiconductor layer and abuts against the semiconductor layer. The first fin has a first top surface and a first bottom surface, and the second fin has a second top surface and a second bottom surface. The first surface may be substantially flush with the second top surface. The first bottom surface and the second bottom surface may abut against the semiconductor layer, while the height of the first fin may be different from the height of the second fin.

More specifically, the SRAM cell may comprise 6 FETS, that is, a first pull-up PFET, a first pull-down NFET, a first pass gate NFET, a second pull-up PFET, a second pull-down NFET, and a second pass gate NFET. These 6 FETs can be connected with each other in the same manner as the conventional SRAM cell. Among the 6 FETs, the first pull-down NFET and the second pull-down NFET have a relatively larger fin height, while the remaining FETs have a relatively smaller fin height. Preferably, the fin height of each of the first pull-down NFET and the second pull-down NFET is twice the fin height of the remaining FETs.

According to a further embodiment, in isotropically etching back the isolation layers, some of the isolation layers at steps present at the semiconductor layer 1000 (that is, interfaces between the regions of the pull-up FETs and the pass gate FETs and the regions of the pull-down FETs) may be protected from being etched.

Figure 17:
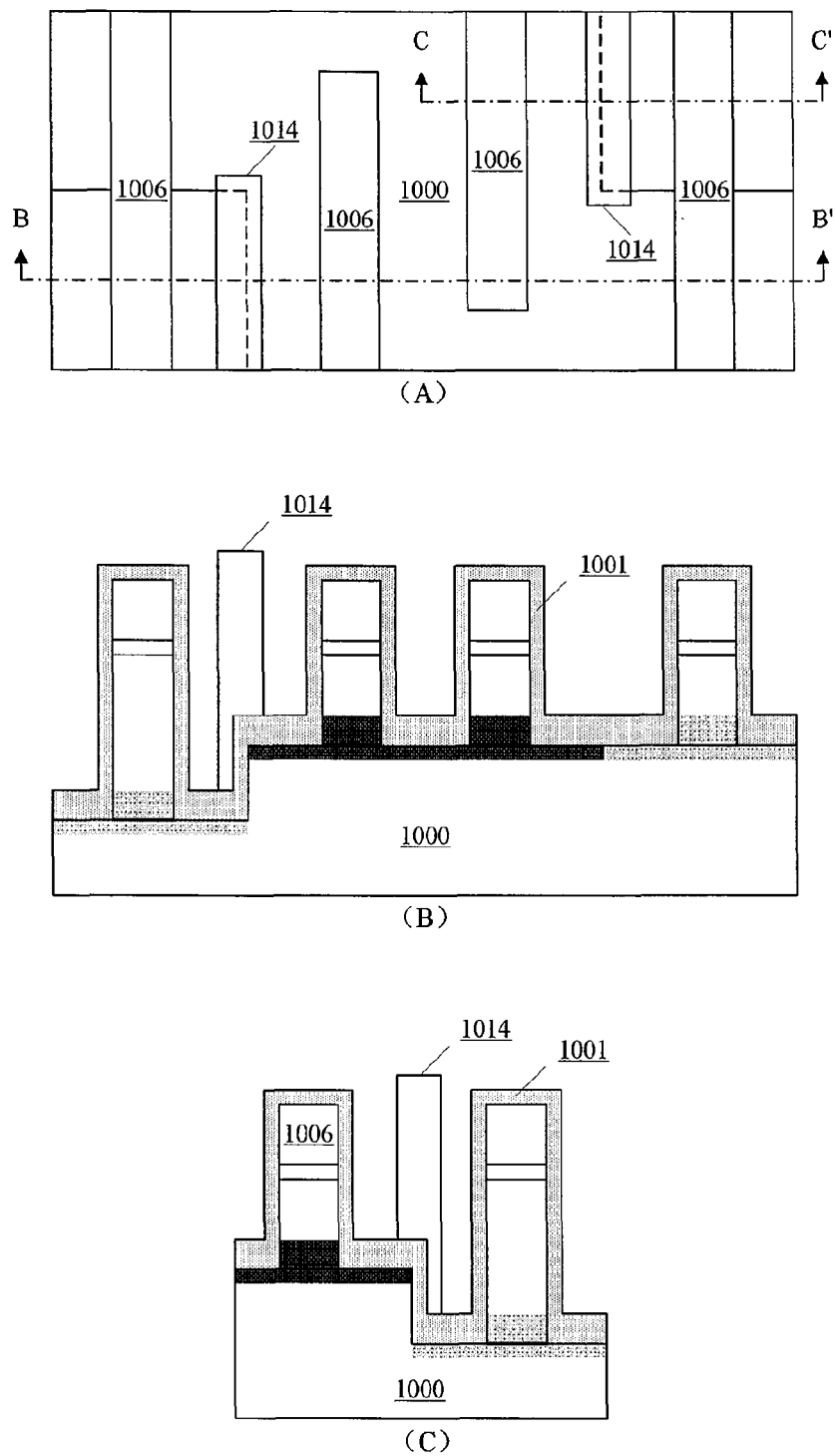
FIGS. 17-19 are schematic views showing structures obtained in different steps in a flow of manufacturing a semiconductor structure according to a further embodiment of the present disclosure, wherein (A) is a top view, (B) is a cross-section view taken along line B-B', and (C) is a cross-section view taken along line C-C'.

Specifically, as shown in FIG. 17, after the formation of the oxide layer 1001 which has thicker bottom portions and thinner portions on the sidewalls of the respective fins (referring to above descriptions in conjunction with FIG. 12), a mask layer such as a photo resist layer 1014 may be formed and then patterned to cover the stepped portions. It is to be noted that the photo resist layer 1014 can cover all of the stepped portions, though it is shown in FIG. 17 that only some of the stepped portions are covered.

Figure 18:
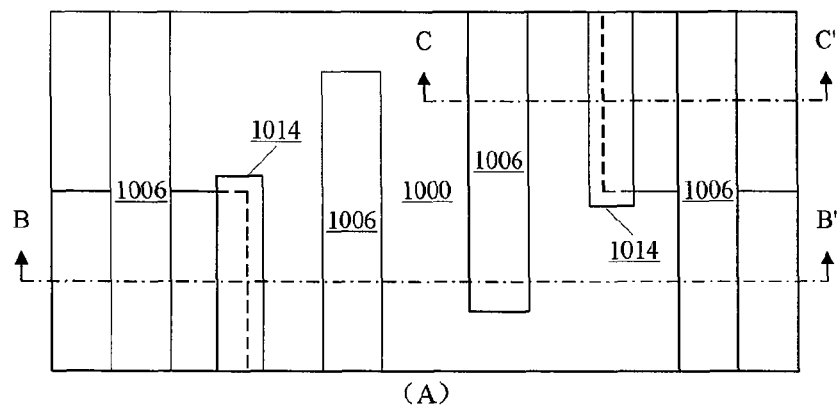
Figure 18:
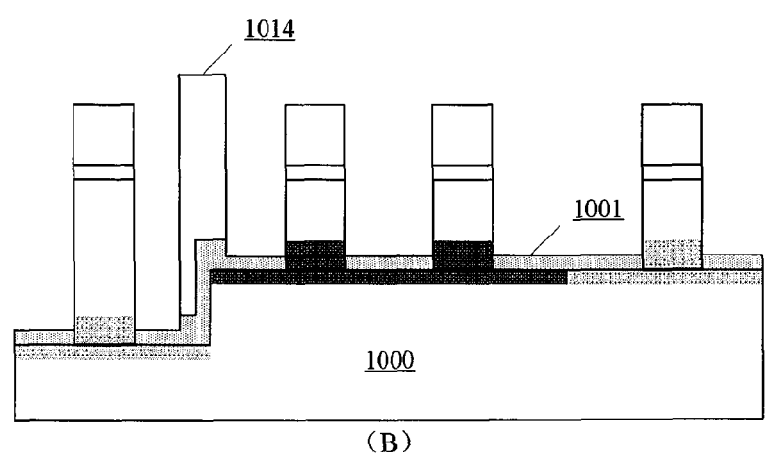
Figure 18:
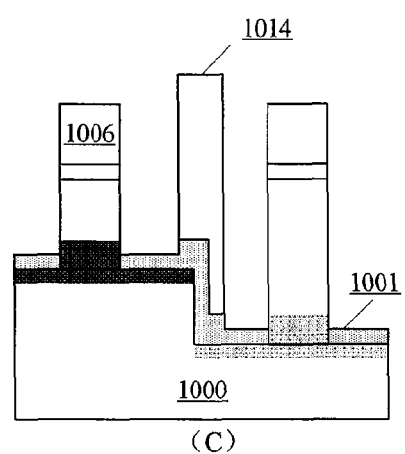

Then, as shown in FIG. 18, the oxide layer 1001 may be isotropically etched back to achieve the isolation layers 1001. Unlike the isolation layers shown in FIG. 13, the isolation layers in this embodiment further comprises portions at the stepped portions.

Figure 19:
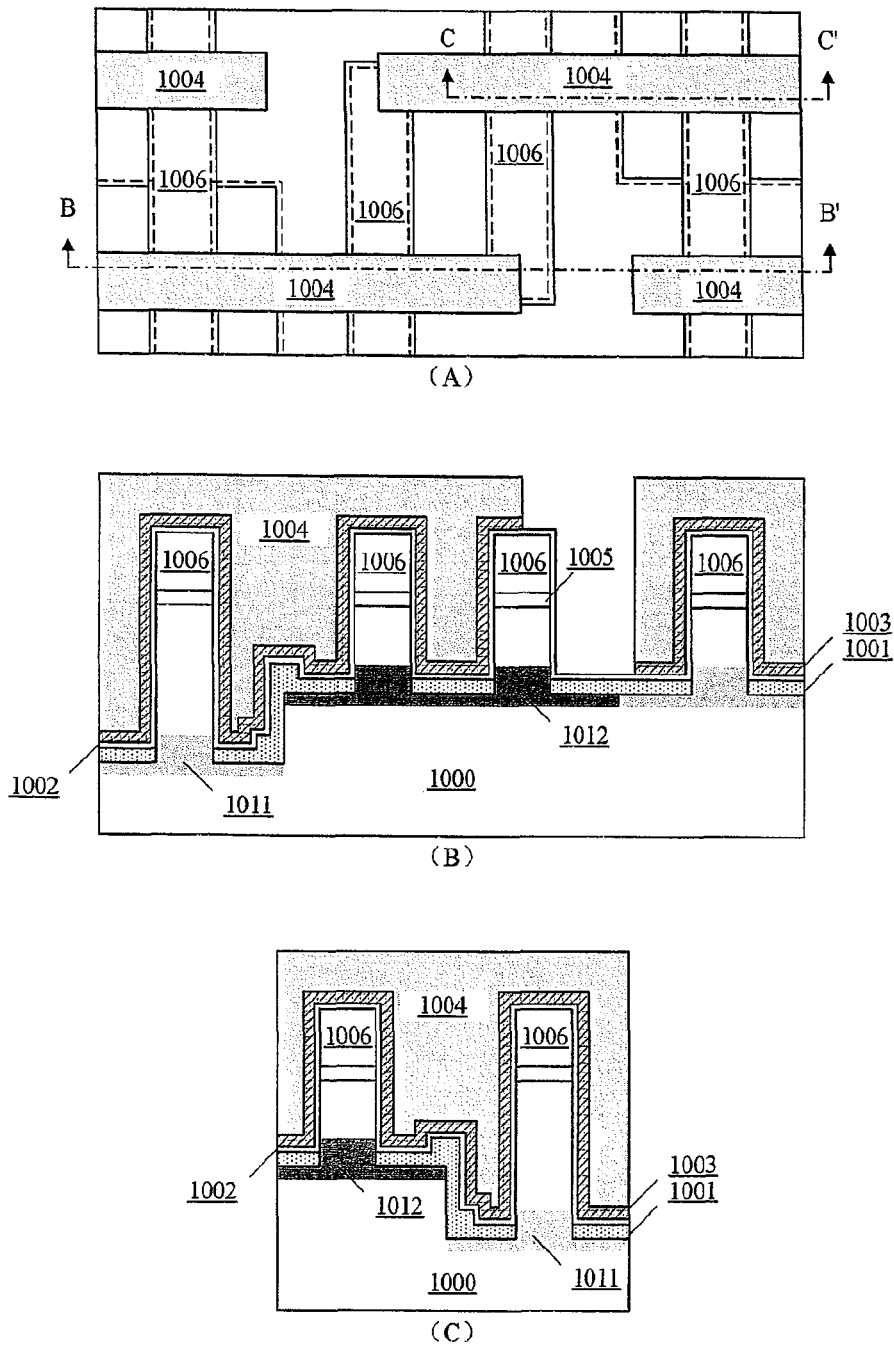

After the formation of the isolation layers, the process may be continued in the same manner as the above embodiment to achieve the SRAM cell shown in FIG. 19. This SRAM cell is substantially the same as the SRAM cell shown in FIG. 16, except that there are the isolation layers at the stepped portions.

In the above descriptions, details of patterning and etching of the layers are not described. It is understood by those skilled in the art that various measures may be utilized to form the layers and regions in desired shapes. Further, to achieve the same feature, those skilled in the art can devise processes which are not completely the same as those described above.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A Static Random Access Memory (SRAM) cell, comprising:
    a semiconductor layer; and a first Fin Field Effect Transistor (FinFET) and a second FinFET formed on the semiconductor layer,
    wherein the first FinFET comprises a first fin formed of a first portion of the semiconductor layer, the first fin having a first top surface and a first bottom surface, with a first height defined by a maximum distance from the first bottom surface to the first top surface,
    wherein the second FinFET comprises a second fin formed of a second portion of the semiconductor layer, the second fin having a second top surface and a second bottom surface, with a second height defined by the maximum distance from the second bottom surface to the second top surface,
    wherein the first top surface is substantially flush with the second top surface, the first bottom surface and the second bottom surface abut against a first corresponding uppermost surface and a second corresponding uppermost surface of remaining portions of the semiconductor layer and are at different levels, and the second height of the second fin is greater than the first height of the first fin,
    wherein each of the first FinFET and the second FinFET comprises:
        a gate stack crossing over a respective one of the first fin and the second fin,
        wherein the gate stack comprises a gate dielectric layer and a gate electrode layer formed over the gate dielectric layer,
        wherein the gate stack is separated from the remaining portions of the semiconductor layer by an isolation layer, and
    wherein the isolation layer for the first FinFET has a substantially same thickness as the isolation layer for the second FinFET.

2. The SRAM cell according to claim 1, wherein the semiconductor layer comprises a bulk semiconductor substrate.

3. The SRAM cell according to claim 1, wherein at least one of the first fin and the second fin comprises a block region at the bottom of the at least one of the first fin and the second fin.

4. The SRAM cell according to claim 3, wherein the block region comprises n-type dopants for a p-type FinFET, and p-type dopants for an n-type FinFET.

* * * * *